(12) United States Patent
Mimura et al.

(10) Patent No.: US 12,181,790 B2
(45) Date of Patent: Dec. 31, 2024

(54) REFLECTIVE MASK BLANK AND REFLECTIVE MASK

(71) Applicant: Shin-Etsu Chemical Co., Ltd., Tokyo (JP)

(72) Inventors: Shohei Mimura, Joetsu (JP); Hideo Kaneko, Joetsu (JP); Tsuneo Terasawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 480 days.

(21) Appl. No.: 17/669,986

(22) Filed: Feb. 11, 2022

(65) Prior Publication Data

US 2022/0283492 A1 Sep. 8, 2022

(30) Foreign Application Priority Data

Mar. 3, 2021 (JP) .................................. 2021-033118
Jan. 18, 2022 (JP) .................................. 2022-005408

(51) Int. Cl.
*G03F 1/24* (2012.01)

(52) U.S. Cl.
CPC ...................................... *G03F 1/24* (2013.01)

(58) Field of Classification Search
CPC ........................................................ G03F 1/24
USPC ............................................................. 430/5
See application file for complete search history.

(56) References Cited

U.S. PATENT DOCUMENTS

| | | | |
|---|---|---|---|
| 11,187,972 B2 * | 11/2021 | Ikebe | ........................ G03F 1/80 |
| 2019/0205585 A1 | 8/2019 | Ikebe et al. | |
| 2019/0384157 A1 | 12/2019 | Ikebe et al. | |
| 2021/0208498 A1 | 7/2021 | Ikebe et al. | |
| 2022/0011662 A1 | 1/2022 | Komize et al. | |

FOREIGN PATENT DOCUMENTS

| | | |
|---|---|---|
| JP | 2002-246299 A | 8/2002 |
| JP | 2018-44979 A | 3/2018 |
| KR | 10-2016-0010098 A | 2/2016 |
| WO | WO 2019/225738 A1 | 11/2018 |
| WO | WO 2020/100632 A1 | 8/2020 |

OTHER PUBLICATIONS

Extended European Search Report for European Application No. 22159543.2, dated Jul. 29, 2022.

* cited by examiner

*Primary Examiner* — Christopher G Young
(74) *Attorney, Agent, or Firm* — Birch, Stewart, Kolasch & Birch, LLP

(57) ABSTRACT

A reflective mask blank that is a material for a reflective mask used in EUV lithography using EUV light as exposure light, including a substrate, a multilayer reflection film that is formed on one main surface of the substrate and reflects the exposure light, and an absorber film containing tungsten, and another metal, a metalloid or a light element that is formed on the multilayer reflection film and absorbs the exposure light.

15 Claims, 3 Drawing Sheets

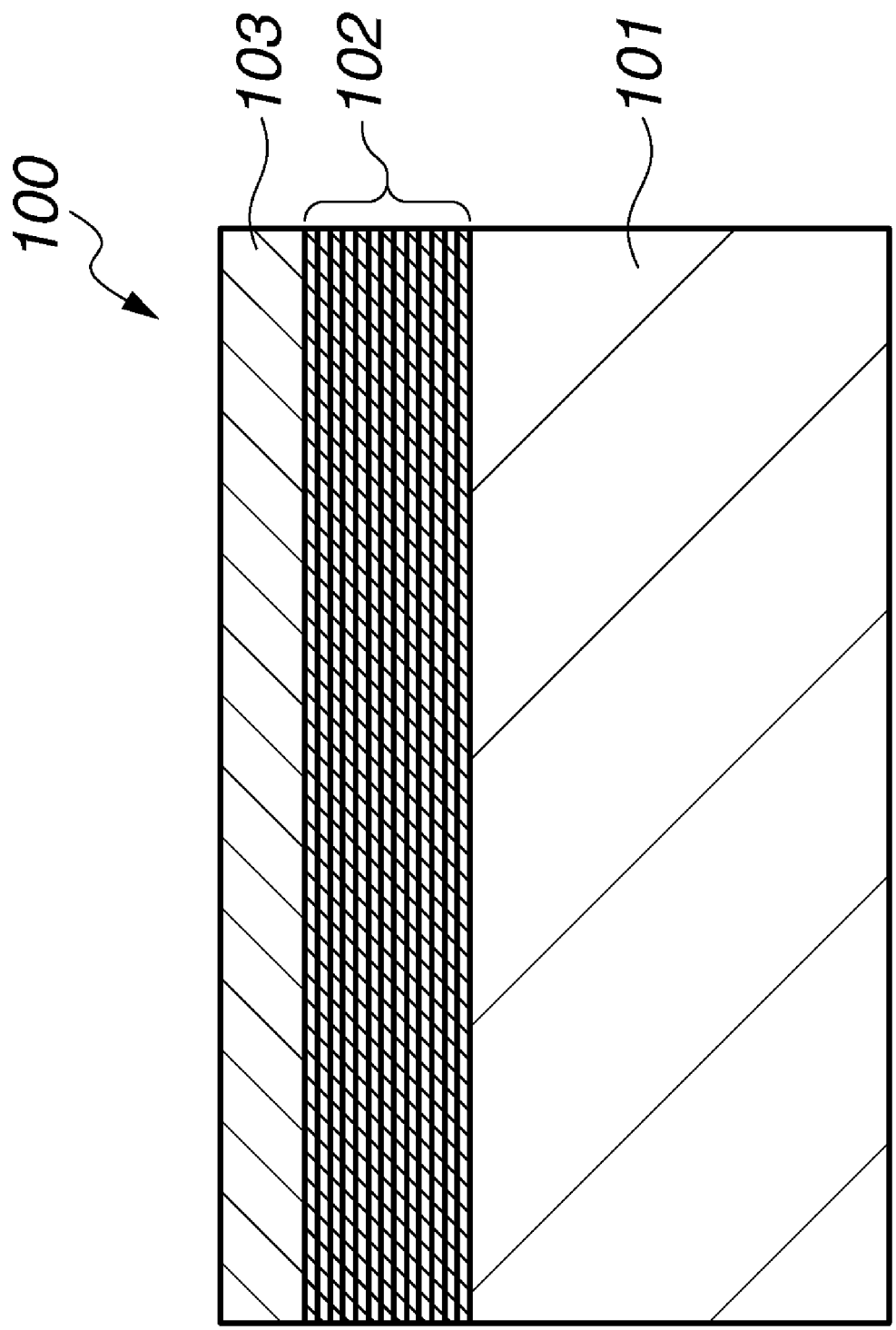

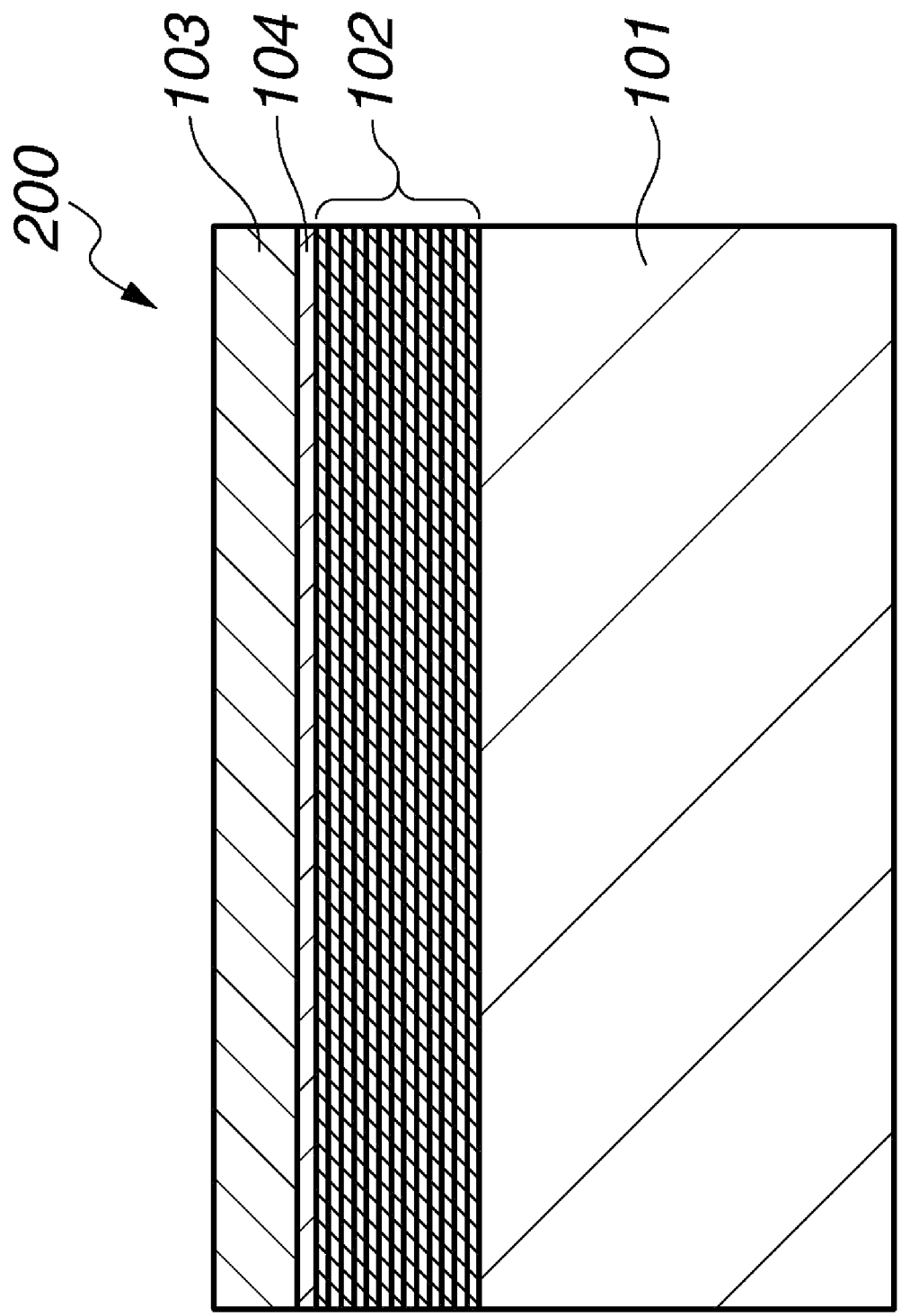

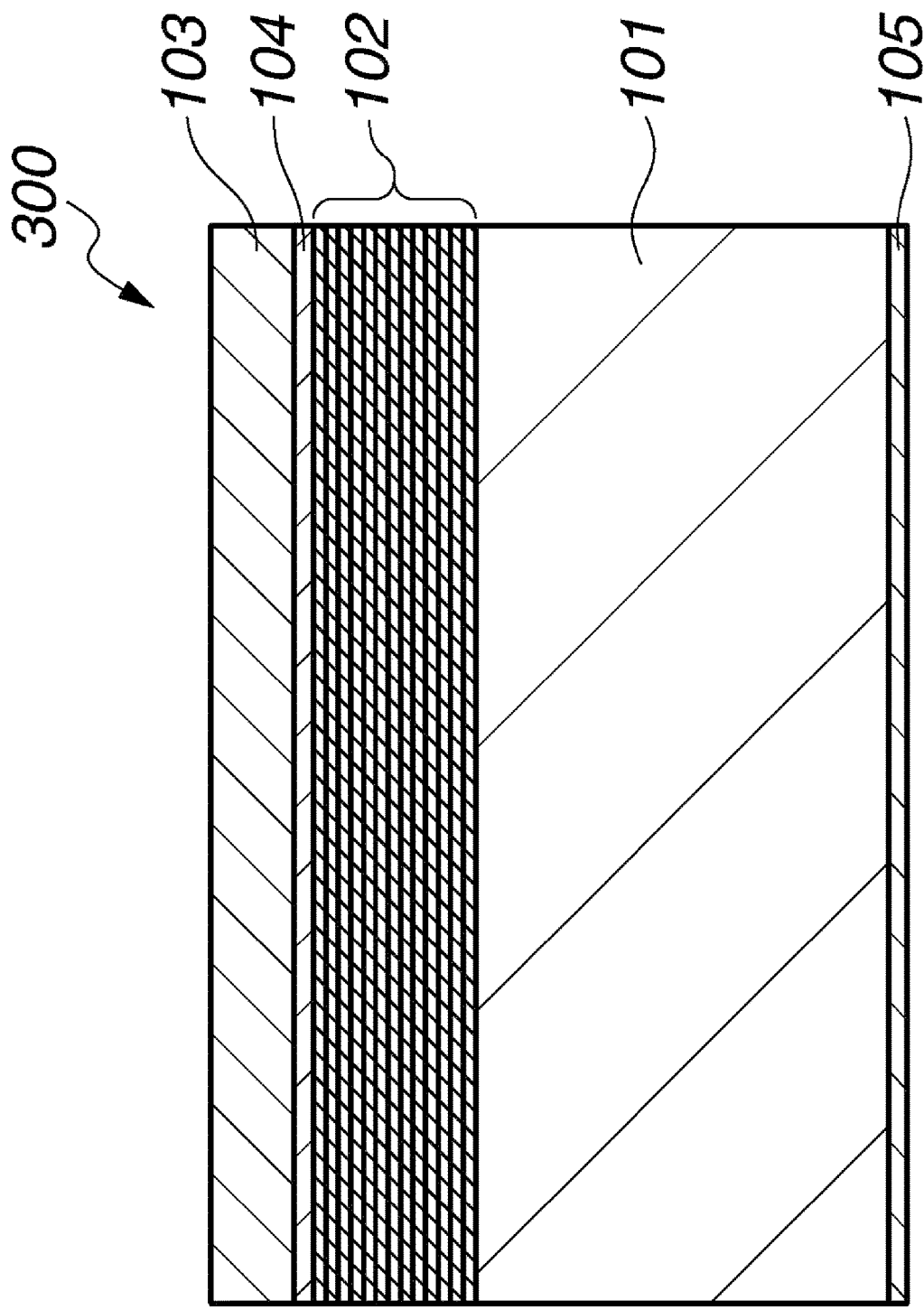

REFLECTIVE MASK BLANK AND REFLECTIVE MASK

CROSS-REFERENCE TO RELATED APPLICATION

This non-provisional application claims priority under 35 U.S.C. § 119(a) on Patent Application Nos. 2021-033118 and 2022-005408 filed in Japan on Mar. 3, 2021 and Jan. 18, 2022, respectively, the entire contents of which are hereby incorporated by reference.

TECHNICAL FIELD

The present invention relates to a reflective mask blank which is a material for a reflective mask used for manufacturing a semiconductor device such as a LSI, and a reflective mask.

BACKGROUND ART

In a manufacturing process of a semiconductor device, a photolithography technique in which a circuit pattern formed on a transfer mask is transferred onto a semiconductor substrate (semiconductor wafer) through a reduction projection optical system with irradiating exposure light to the transfer mask is used. At present, a mainstream wavelength of the exposure light is 193 nm by argon fluoride (ArF) excimer laser light.

However, since it is necessary to form a further fine pattern, EUV lithography technique using, as exposure light, extreme ultraviolet (hereinafter referred to "EUV") light having a wavelength shorter than the ArF excimer laser light is promising. EUV light is light having a wavelength of about 0.2 to 100 nm, more specifically, light having a wavelength of about 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask has a multilayer reflection film that is formed on a substrate and reflects EUV light, and a patterned absorber film that is formed on the multilayer reflection film and absorbs EUV light, and such a mask is used as a common reflective mask. A pattern is formed on an object to transfer the pattern such as a silicon wafer by utilizing a difference of reflectance of EUV light as an exposure light, caused by presence and absence of the absorber film on the multilayer reflection film.

A reflective mask is manufactured from a reflective mask blank. The reflective mask blank includes a multilayer reflection film that is formed on a substrate and reflects exposure light, and an absorber film that is formed thereon and has a low reflectance with respect to the exposure light, and further commonly includes a protection film between the multilayer reflection film and the absorber film. The multilayer reflection film is formed by laminating alternately layers having different refraction indexes. For example, a multilayer reflection film in which molybdenum (Mo) layers and silicon (Si) layers are alternately laminated is used for EUV light exposure, and an absorber film which contains tantalum (Ta) with adding nitrogen (N) is used for EUV light exposure (Patent Document 1: JP-A 2002-246299).

CITATION LIST

Patent Document 1: JP-A 2002-246299

SUMMARY OF THE INVENTION

In order to transfer a fine pattern to a semiconductor substrate or the like with using a reflective mask, an absorber film of a reflective mask blank is partially removed to form a pattern. Therefore, the absorber film requires the following properties to transfer a fine pattern with high accuracy.

When a pattern of an absorber film is formed by dry etching, if an etching rate is low, a thick resist film must be formed to form the pattern, and even if a hard mask film is used, the hard mask film may also be etched when the absorber film is etched. Thus, a high etching rate for the absorber film is preferable to form a pattern with high accuracy. When an etching amount of an etching mask such as a resist film becomes large, a cross-sectional shape tends to deteriorate. Therefore, it is important to have a high etching rate for the absorber film to form a pattern with a good cross-sectional shape. Further, in order to attain further improvement of processability of the absorber film, a material having a high etching rate is required for the absorber film.

In addition, if the absorber film is thick, pattern resolution is lowered due to shadowing effect. Thus, a thin absorber film is needed. Further, when the absorber film is used as a film having phase shift function, a material having a smaller refractive index n is required to thin the film. Furthermore, the reflective mask for EUV is irradiated with high-energy pulsed EUV light when exposing. Heat resistance of the absorber film is important since it is said that the absorber film in the reflective mask momentarily becomes high temperature (for example, about 500° C.). Therefore, there is a demand for a film having quality that does not deteriorate due to oxidation or the like even at such a high temperature. On the other hand, if roughness of side wall is large when forming a pattern, resolution may be adversely affected. However, an absorber film composed of a material of simple substance of tungsten has concave-convex surface, and tends to be increased the roughness of the side wall of the pattern.

The present invention has been made to solve the above problems, and an object of the present invention is to provide a reflective mask blank having pattern resolutionability improved by a thin absorber film having excellent processability, and a reflective mask manufactured by using the reflective mask blank.

The inventors have been found that when tungsten is used as a material for an absorber film, etching rate is high, and a low refraction index n suitable for using the absorber film as a film having phase shift function can be attained. Thus, tungsten is effective for forming a thin absorber film, and tungsten has an advantage as a material for an absorber film.

Further, the inventors have been found that when at least one element selected from the group consisting of metalloids and metals excluding tungsten, or at least one light element selected from the group consisting of nitrogen, oxygen, carbon and hydrogen is used along with tungsten, as a material for an absorber film, surface irregularity of the absorber film is improved. Particularly, an absorber film containing at least one element selected from the group consisting of metalloids and metals excluding tungsten, specifically, containing molybdenum or ruthenium, along with tungsten is uneasily oxidized even at high temperature and exhibits good heat resistance when using in exposure by EUV light.

In one aspect, the invention provides a reflective mask blank that is a material for a reflective mask used in EUV lithography using EUV light as exposure light, including a substrate, a multilayer reflection film that is formed on one main surface of the substrate and reflects the exposure light, and an absorber film that is formed on the multilayer reflection film and absorbs the exposure light, wherein
the absorber film contains
(a) tungsten; and
(b) at least one element selected from the group consisting of metalloids and metals excluding tungsten, (c) at least one light element selected from the group consisting of nitrogen, oxygen, carbon and hydrogen, or both (b) and (c).

Preferably, the absorber film consists of (a) tungsten, and (b) at least one element selected from the group consisting of metalloids and metals excluding tungsten.

Preferably, the absorber film contains (a) tungsten, (b) at least one element selected from the group consisting of metalloids and metals excluding tungsten, and (c) at least one light element selected from the group consisting of nitrogen, oxygen, carbon and hydrogen.

Preferably, a total content of (a) tungsten, (b) at least one element selected from the group consisting of metalloids and metals excluding tungsten, and (c) at least one light element selected from the group consisting of nitrogen, oxygen, carbon and hydrogen is not less than 90 at %.

Preferably, (b) at least one element selected from the group consisting of metalloids and metals excluding tungsten is either or both of molybdenum and ruthenium.

Preferably, a content of (b) at least one element selected from the group consisting of metalloids and metals excluding tungsten is not less than 1 at % and not more than 80 at %.

Preferably, the absorber film contains (a) tungsten, and (c) at least one light element selected from the group consisting of nitrogen, oxygen, carbon and hydrogen, and is free of metalloids and metals excluding tungsten.

Preferably, a content of (c) at least one light element selected from the group consisting of nitrogen, oxygen, carbon and hydrogen is not less than 10 at % and not more than 80 at %.

Preferably, a total content of (a) tungsten, and (c) at least one light element selected from the group consisting of nitrogen, oxygen, carbon and hydrogen is not less than 90 at %.

Preferably, a content of (a) tungsten in the absorber film is not less than 20 at % and not more than 99 at %.

Preferably, the absorber film has a refractive index n of not more than 0.94 with respect to the exposure light.

Preferably, the absorber film has a thickness of not more than 70 nm.

Preferably, the reflective mask blank includes a protection film wherein the protection film is intervened between the multilayer reflection film and the absorber film, is contact with the multilayer reflection film, and has different etching property from the absorber film.

Preferably, the reflective mask blank further includes a conductive film formed on the other main surface of the substrate.

Preferably, the reflective mask blank further includes a film containing chromium formed as an etching mask on the absorber film.

In another aspect, the invention provides a reflective mask manufactured from the reflective mask blank.

Advantageous Effects of the Invention

The reflective mask obtained from the reflective mask blank including the absorber film of the invention has good surface conditions and pattern properties. Particularly, the absorber film containing tungsten, and at least one element selected from the group consisting of metalloids and metals excluding tungsten has good film stability even at high temperature and is uneasily oxidized. Therefore, according to the reflective mask of the invention, a fine pattern can be transferred to a semiconductor substrate by EUV light with high accuracy.

BRIEF DESCRIPTION OF THE DRAWINGS

FIG. 1 is a cross-sectional view illustrating an example of a reflective mask blank.

FIG. 2 is a cross-sectional view illustrating another example of a reflective mask blank.

FIG. 3 is a cross-sectional view illustrating the other example of a reflective mask blank.

DESCRIPTION OF THE PREFERRED EMBODIMENT

A reflective mask blank of the invention includes a substrate, a multilayer reflection film that is formed on the substrate, particularly, on one main surface (front side surface) of the substrate and reflects exposure light, specifically, a multilayer reflection film for reflection of exposure light such as extreme ultraviolet (EUV) light, and an absorber film that is formed on the multilayer reflection film and absorbs the exposure light, specifically, an absorber film for absorption of exposure light such as EUV light and reduction of reflectance. A reflective mask such as a EUV reflective mask including an absorber pattern (a pattern of the absorber film) formed by patterning the absorber film is manufactured from a reflective mask blank utilizing EUV light as exposure light such as a EUV reflective mask blank. The EUV light for EUV lithography using EUV light as exposure light has a wavelength of 13 to 14 nm, typically about 13.5 nm.

The multilayer reflection film is preferably disposed contiguously on one main surface of the substrate. However, an underlayer film may be provided between the substrate and the multilayer reflection film as long as effects of the invention are not impaired. The absorber film may be disposed contiguously on the multilayer reflection film. However, a protection film (a protection film for the multilayer reflection film) having different etching property from the absorber film may be provided between the multilayer reflection film and the absorber film. The protection film is disposed preferably in contact with the multilayer reflection film, more preferably in contact with both of the multilayer reflection film and the absorber film. The protection film is used to protect the multilayer reflection film in processing step such as cleaning and correction. Further, the protection film preferably has a function of protecting the multilayer reflection film when the absorber film is patterned by etching, or a function of preventing oxidation of the multilayer reflection film. Furthermore, a hard mask film (an etching mask film for the absorber film) having different etching property from the absorber film may be provided on the side remote from the substrate of the absorber film, preferably disposed in contact with the absorber film. On the other hand, a conductive film may be formed under the other main surface (back side surface) of the substrate which is the opposite side to the one main surface, preferably formed in contact with the other main surface. The conductive film is used for holding a reflective mask on an exposure tool by an electrostatic chuck. In the above description, one main surface of the substrate is defined as the front side or the upper side, and the other main surface is defined as the back side or the lower side. However, the front and back sides or the upper and lower sides in both surfaces are defined for the sake of convenience. Two main surfaces (film forming surfaces) are one and the other main surfaces, respectively. The front and back sides or the upper and lower sides may be alternated.

Typical examples of reflective mask blanks of the invention are shown in FIGS. 1 to 3. FIG. 1 is a cross-sectional view illustrating an example of a reflective mask blank. The reflective mask blank 100 includes a multilayer reflection film 102 disposed contiguously on one main surface of a substrate 101, and an absorber film 103 disposed contiguously on the multilayer reflection film 102. FIG. 2 is a cross-sectional view illustrating another example of a reflective mask blank. The reflective mask blank 200 includes a multilayer reflection film 102 disposed contiguously on one main surface of a substrate 101, a protection film 104 disposed contiguously on the multilayer reflection film 102, and an absorber film 103 disposed contiguously on the protection film 104. FIG. 3 is a cross-sectional view illustrating the other example of a reflective mask blank. The reflective mask blank 300 includes a multilayer reflection film 102 disposed contiguously on one main surface of a substrate 101, a protection film 104 disposed contiguously on the multilayer reflection film 102, an absorber film 103 disposed contiguously on the protection film 104, and a conductive film 105 disposed contiguously on the other main surface of a substrate 101.

For example, a 6025 substrate which has a size of 6 inch×6 inch×0.25 inch-thick may be used as the substrate of the invention. In the case where the SI unit system is used, the 6025 substrate is generally represented as a substrate having a size of 152 mm×152 mm×6.35 mm thick. The substrate is necessary to be reduced distortion of the pattern due to thermal expansion during exposure, thus, coefficient of thermal expansion of the substrate is preferably not more than 30 ppb/° C., more preferably not more than 10 ppb/° C., as an absolute value. Examples of a material for the substrate include a titania-doped quartz glass ($SiO_2$—$TiO_2$-based glass) and other materials.

A flat substrate is preferable in viewpoint to obtain high position accuracy in detecting defects in the multilayer reflection film, forming an absorber pattern, or detecting defects in the absorber film. On the main surface which is the side of forming the multilayer reflection film, a flatness is preferably not more than 0.1 μm, more preferably not more than 0.05 μm, in an exposure pattern forming area. The exposure pattern forming area is, for example, in case of a 6025 substrate, the central area of the main surface, for example, a range of 132 mm×132 mm. In order to obtain high reflectance on the main surface which is the side of forming the multilayer reflection film, a surface roughness is preferably small. Thus, the surface roughness Rq (RMS: root mean square roughness) is preferably not more than 0.15 nm, more preferably not more than 0.1 nm. In the invention, the surface roughness Rq may be a value measured, for example, in the range of 1 μm-square by an atomic force microscope (AFM).

On the other hand, the other main surface which is the opposite side to the one main surface on which a multilayer reflection film is formed is usually a surface to be sucked when the reflective mask is set on an exposure tool. Thus, the other main surface of the substrate is also preferably flat, and the flatness is preferably not more than 1 μm to obtain sufficient pattern position accuracy.

In the reflective mask, the multilayer reflection film is a film for reflecting exposure light such as EUV light. As the multilayer reflection film, an alternately laminated layers consisting of a plurality of kinds of layers having different optical properties, for example, two kinds of layers consisting of a layer A and a layer B laminated alternately and having different optical properties each other are used. Particularly, a plurality of kinds of layers having different refractive indexes, for example, a high refractive index and a low refractive index are laminated periodically. For EUV light, silicon (Si) is used as a material having the high refraction index, molybdenum (Mo) is used as a material having the low refraction index, and a Si/Mo laminated film in which silicon (Si) layers and molybdenum (Mo) layers are alternately laminated is exemplified as the multilayer reflection film. The plurality of kinds of layers are laminated, for example, not less than 2 cycles (not less than 2 layers, respectively), preferably not less than 40 cycles (not less than 40 layers, respectively), and not more than 60 cycles (not more than 60 layers, respectively). When the cycles are too few, reflectance may be low, and when the cycles are too many, the film may become thick and have large film stress. In case of the Si/Mo laminated film, the silicon (Si) layer and the molybdenum (Mo) layer preferably consist of, respectively, silicon only and molybdenum only. However, the silicon layer and the molybdenum layer may be composed of a silicon compound and a molybdenum compound, respectively.

In case of the Si/Mo laminated film, the layer closest to the substrate may be either the Si layer or the Mo layer. The layer remotest from the substrate may be either the Si layer or the Mo layer, however, the remotest layer is preferably the Si layer. Thicknesses of a high refraction index layer and a low refraction index layer in the multilayer reflection film are set to suitable thicknesses in accordance with an exposure wavelength. For example, in case of EUV light (an exposure wavelength of 13 to 14 nm), a thickness both of the high refraction index layer and the low refraction index layer per one cycle is preferably adjusted to 6 to 8 nm, and a thickness of the high refraction index layer is preferably adjusted to 10 to 90% of the thickness of the one cycle. In addition, each thickness of the high refraction index layers and the low refraction index layers may be constant or individually different. A thickness of the whole of the multilayer reflection film is normally about 240 to 320 nm. In addition, in the reflective mask blank (reflective mask blank for EUV) and the reflective mask (reflective mask for EUV), the multilayer reflection film on which a protection film is laminated or not has a reflectance of normally 65 to 67% with respect to EUV light.

Although it depends on the composition and layer configuration of the multilayer reflection film, for example, the multilayer reflection film has a reflectance with respect to extreme ultraviolet (EUV) light of preferably not less than 60%, more preferably not less than 65%, at an incident angle of 6°.

As a method for forming the multilayer reflection film, a sputtering method in which power is supplied to a target and an ambient gas is turned into plasma (ionization) by the supplied power to perform sputtering, and an ion beam sputtering method in which an ion beam is irradiated to a target are exemplified. As a sputtering method, a DC sputtering method in which a DC voltage is applied to a target, and an RF sputtering method in which a high frequency voltage is applied to a target.

The sputtering method is a film forming method that utilizes sputtering phenomenon by gas ions with applying a voltage to a target and feeding a gas such as Ar gas into a chamber, to ionize the gas. Particularly, a magnetron sputtering method has an advantage in productivity. The magnetron sputtering method is a sputtering method in which a magnet is placed to the back side of a target thereby a plasma density of the target is increased at the vicinity above the target by a magnetic field. The magnetron sputtering is preferably applied for the film forming since even if a gas pressure (sputtering pressure) is low in discharge, plasma can be maintained, and a film forming rate is high. The power may be applied to the target by a DC system or an RF system. The DC system includes also a pulse sputtering in which a negative bias applied to the target for a short time in order to prevent charge-up of the target.

The forming of the multilayer reflection film by the sputtering method may be performed, for example, by using a sputtering apparatus capable of being attached a plurality of targets. Specifically, the multilayer reflection film may be formed by using a metal or metalloid target (for example, Si target) constituting the layer A, a metal or metalloid target (for example, Mo target) constituting the layer B, and a rare gas such as Ar to gas and Kr gas, as a sputtering gas, facing each target and the main surface of the substrate each other, and then sputtering alternately the metal or metalloid target constituting the layer A and the metal or metalloid target constituting the layer B to form alternately the layer A and the layer B. Sputtering is preferably carried out while rotating the substrate along the main surface.

In case of the Si/Mo laminated film, when the silicon (Si) layer and the molybdenum (Mo) layer are composed of a silicon compound and a molybdenum compound, respectively, the film can be formed by reactive sputtering in which, as a sputtering gas, a reactive gas such as an oxygen-containing gas, a nitrogen-containing gas, a carbon-containing gas, and other gases is used along with a rare gas. Further, the target may be composed of a silicon compound or a molybdenum compound.

The absorber film formed on the multilayer film is a film that absorbs exposure light and reduces a reflectance of the exposure light. A transfer pattern in a reflective mask is formed by a difference of reflectance between a portion on which the absorber film is formed and a portion on which the absorber film is not formed. The absorber film of the invention may be a single layer or a plurality of layers.

The absorber film of the invention contains tungsten. A film containing tungsten has a high etching rate and a low refraction index n suitable for using the absorber film as a film having phase shift function. Thus, the film is effective for forming a thin absorber film. On the other hand, a simple tungsten film has a concave-convex surface. For example, when a dent having a large diameter is observed by an atomic force microscope (AFM), the grain size of the film is large. In such a film, a good shape at the line edge of the pattern cannot be obtained in pattern formation, and in some cases, the film may not be sufficient for the case where higher accuracy is required in pattern formation. Further, if the surface is uneven, sensitivity of defect detection is lowered. Thus, it is preferable to form the absorber film having a uniform surface.

Therefore, the absorber film preferably contains (a) tungsten, and contains (b) at least one element selected from the group consisting of metalloids and metals excluding tungsten, (c) at least one light element selected from the group consisting of nitrogen, oxygen, carbon and hydrogen, or both (b) and (c). According to absorber film of the invention, dents on the surface of the absorber film having sizes that can be observed by an atomic force microscope (AFM) can be downsized or reduced as compared with the case of using tungsten alone. Thus, it is effective that at least one element selected from the group consisting of metalloids and metals excluding tungsten, or at least one light element selected from the group consisting of nitrogen, oxygen, carbon and hydrogen is used for the absorber film along with tungsten.

As the metalloids and metal excluding tungsten, tantalum, molybdenum, vanadium, zirconium, ruthenium, gold, platinum, rhodium, silicon, and germanium are preferable. In particular, it is more preferable that the absorber film contains either or both of molybdenum and ruthenium, as the metalloids and metal excluding tungsten. When the absorber film contains molybdenum, it is considered that dents on the surface of the absorber film having sizes that can be observed by an atomic force microscope (AFM) can be downsized or reduced, and adsorption and immersion of oxygen gas or water from the atmosphere that causes oxidation are reduced. Thus, it is considered that the heat resistance of the absorber film, particularly the oxidation resistance at high temperature, is increased. When the absorber film contains ruthenium, the absorber film having a uniform surface can be formed. Further, the refractive index n can be smaller by the absorber film containing ruthenium. In particular, when the absorber film is a film having phase shift function, not only the film thickness can be reduced, but also the reflectance at an intended phase shift can be set high.

In the case that the absorber film contains tungsten and another element such as at least one element selected from the group consisting of metalloids and metals excluding tungsten, and at least one light element selected from the group consisting of nitrogen, oxygen, carbon and hydrogen, a tungsten content in the absorber film is preferably not less than 20 at %, more preferably not less than 40 at %, and preferably less than 100 at %, more preferably not more than 99 at %, even more preferably not more than 80 at %. On the other hand, in the case that the absorber film contains at least one element selected from the group consisting of metalloids and metals excluding tungsten, a content of the at least one element selected from the group consisting of metalloids and metals excluding tungsten is preferably more than 0 at %, more preferably not less than 1 at %, even more preferably not less than 20 at %, and preferably not more than 80 at %, more preferably not more than 60 at %. The absorber film may contain at least one light element selected from the group consisting of nitrogen, oxygen, carbon and hydrogen. In this case, a content of the light element, as the total content, is more than 0 at %, and is preferably not more than 80 at %, more preferably less than 80 at %, even more preferably not more than 79 at %, most preferably not more than 76 at %. The content of the light element is preferably not less than 10 at %, more preferably not less than 30 at %, even more preferably not less than 50 at %. In addition, in the case that the absorber film contains the at least one element selected from the group consisting of metalloids and metals excluding tungsten, and does not contain the light element, a total content of tungsten, and the at least one element selected from the group consisting of metalloids and metals excluding tungsten is preferably not less than 90 at %, more preferably not less than 99 at %, even more preferably 100 at %, of all components constituting the absorber film. In the case that the absorber film contains the light element and does not contain the at least one element selected from the group consisting of metalloids and metals excluding tungsten, a total content of tungsten, and the light element is preferably not less than 90 at %, more preferably not less than 99 at %, even more preferably 100 at %, of all components constituting the absorber film. In the case that the absorber film contains both of the at least one element selected from the group consisting of metalloids and metals excluding tungsten and the light element, a total content of tungsten, the at least one element selected from the group consisting of metalloids and metals excluding tungsten, and the light element is preferably not less than 90 at %, more preferably not less than 99 at %, even more preferably 100 at %, of all components constituting the absorber film. The composition of the absorber film in the thickness direction may be constant or may have a graded composition (a composition in which composition ratio varies in the thickness direction).

A refractive index n of the absorber film is preferably low with respect to the exposure light. The refractive index n at a wavelength of the exposure light is preferably not more than 0.94, more preferably not more than 0.93. An absorber film having a low refractive index n with respect to the exposure light is preferable since a thin film can be formed in the case that an absorber film is utilized as a film having phase shift function. Particularly, the absorber film of the invention is advantageous as compared with a conventionally used tantalum absorber film since a thin film can be formed in the case that an absorber film is utilized as a film having phase shift function.

A thin absorber film is preferable. A thick absorber film causes not only disadvantage for pattern formation, but also reduction of pattern resolution by shadowing effect when exposing. Therefore, a thickness of the absorber film is preferably not more than 70 nm, more preferably not more than 60 nm, and even more preferably not more than 50 nm. On the other hand, a lower limit of the thickness may be not less than 10 nm, and is preferably not less than 20 nm.

If a surface roughness of the absorber film increases, sensitivity of defect detection deteriorates. Therefore, a surface roughness Rq (RMS: root mean square roughness) of the absorber film is preferably not more than 0.7 nm, more preferably not more than 0.5 nm, even more preferably not more than 0.3 nm.

It is preferable that the absorber film can be dry-etched with a fluorine-based gas not containing oxygen. When dry etching can be performed with a fluorine-based gas not containing oxygen, a protection film composed of a material containing ruthenium (Ru), which will be described later, can be used as the protection film for the multilayer reflection film. Examples of the fluorine-based gas not containing oxygen include $CF_4$ and $SF_6$. When a pattern of the absorber film is formed by dry etching, it is preferable that an etching rate is high. An etching rate of the absorber film is preferably three times or more of an etching rate of the protection film etched by the etching applied to the dry etching of the absorber film.

When the substrate is a 6025 substrate which has a main surface of 152 mm square, a variation $\Delta TIR$ of warpages within the central area of the surface of 142 mm square, as a difference before and after forming the absorber film on the multilayer reflection film or the protection film, is preferably not more than 0.4 µm, more preferably not more than 0.3 µm, as an absolute value. A reflective mask having a small amount of change in warpage is a reflective mask blank that has an absorber film with small deviation in the pattern position and low deterioration in dimensional accuracy when the absorber film is patterned to manufacture the reflective mask. Further, when the absorber film has a small amount of variation $\Delta TIR$ of warpages in a condition just after forming the absorber film, it is possible to further reduce the amount of $\Delta TIR$ of warpages by subsequent treatment (for example, heat treatment).

Herein, the central area of the substrate surface within 142 mm square is set an area inside from 5 mm from the peripheral edge of the surface (one main surface) of the 152 mm square substrate on which the absorber film is formed. This area is a region in which a photomask pattern used for exposure using the reflective mask is formed in the reflective mask. As the warpage of the substrate before the absorber film is formed (specifically, after the multilayer reflection film or the multilayer reflection film and the protection film are formed), and the warpage of the substrate after the absorber film is formed, a flatness defined by TIR (Total Indicator Reading) obtained in measuring surface shape by a flatness measuring apparatus is applied. A $\Delta TIR$ as an amount of change in TIR, is defined as a difference between maximum value or minimum value of the amount of change at each coordinate in the substrate plane between when a film is present and when the film is absent on the same substrate where the height of the center of the substrate when the surface shape of the substrate is measured is set as the origin in the height direction. The warpage and the amount of change of warpage can be measured and calculated by a commercially available measuring apparatus such as a flatness tester adopted oblique-incidence interference system (for example, Tropel Ultra Flat 200 Mask, manufactured by Corning Incorporated).

The absorber film may have phase shift function. When the absorber film does not have phase shift function, for the reflective mask, the absorber film formed on the multilayer reflection film, or the absorber film formed on the protection film on the multilayer reflection film has a reflectance of preferably not more than 2%, more preferably not more than 1.5% with respect to EUV light as the exposure light. On the other hand, when the absorber film has phase shift function, the absorber film has a reflectance of preferably not more than 50%, more preferably not more than 30% with respect to EUV light as the exposure light. Further in this case, the reflectance may be more than 2%, and is preferably not less than 3%, more preferably not less than 3.5%.

When the absorber film does not have phase shift function, in the reflective mask, a reflectance ratio of the absorber film portion (absorber pattern portion) to a reflectance of a portion on which the absorber film is not formed (an exposed portion of the multi-layer reflection film or the protection film) is preferably less than 3%, more preferably not more than 2%. On the other hand, when the absorber film has phase shift function, the reflectance ratio is preferably not less than 3%, more preferably not less than 5%, and preferably not more than 50%, more preferably not more than 30%.

A phase shift amount (difference of phase) of the absorber film having phase shift function is a difference of phase between reflected light from a portion on which the absorber film is formed and reflected light from a portion on which the absorber film is not formed (reflected light from the multilayer reflection film or the protection film formed thereon). The phase shift amount is preferably not less than 150°, more preferably not less than 170°, and preferably not more than 260°, more preferably not more than 250°, and even more preferably not more than 230°. Resolution can be increased by using phase shift effect.

A reflectance reducing film having function of reducing reflectance with respect to the inspection light used in inspection of the absorber film may be formed at the side remote from the substrate of the absorber film. The inspection sensitivity of pattern inspection can be increased by this configuration. When the reflectance reducing film can be etched with the same etchant for etching of the absorber film, it is advantageous that the reflectance reducing film can be etched at the same time in etching of the absorber film. On the other hand, when the reflectance reducing film has resistance to the etchant for etching of the absorber film, it is advantageous that the reflectance reducing film can be utilized as a hard mask. Further, a layer for enhancing irradiation resistibility to exposure light may be formed as an outermost surface layer disposed at the side remote from the substrate in the absorber film.

The absorber film can be formed by a sputtering method using a target and a sputtering gas, and the sputtering method is preferably a magnetron sputtering method. Examples of the target include a tungsten target, a target containing at least one element selected from the group consisting of metalloids and metals excluding tungsten, and a target containing tungsten, and at least one element selected from the group consisting of metalloids and metals excluding tungsten. One or more targets can be used in accordance with the film composition. When a plurality of targets are used, targets having different compositions or composition ratios may be used. On the other hand, a rare gas specifically, Ar gas or Kr gas can be used as the sputter gas. In addition, the film can be formed by reactive sputtering in which a target is sputtered with using nitrogen gas ($N_2$), oxygen gas ($O_2$), nitrogen oxide gases ($N_2O$, $NO$, $NO_2$) or other gases as a reactive gas along with the rare gas. For example, when the absorber film is composed of a nitride, nitrogen gas ($N_2$) may be used, and when the absorber film is composed of an oxide, oxygen gas ($O_2$) may be used. Further, when the film is an oxynitride, nitrogen gas ($N_2$) and oxygen gas ($O_2$), or nitrogen oxide gases ($N_2O$, $NO$, $NO_2$) can be used. A pressure inside the sputtering chamber (sputtering pressure) is preferably not less than 0.15 Pa, and preferably less than 0.4 Pa, more preferably not more than 0.3 Pa. If the sputtering pressure is high, it is hard to form a film having high crystallinity. However, if the pressure is too high, not only the surface roughness becomes large, but also oxygen from atmosphere or the like tends to easily diffuse to the film.

Examples of the material of the protection film include a material containing ruthenium (Ru). Particularly, examples of the material containing ruthenium (Ru) include ruthenium (Ru) (simple substance), and a ruthenium alloy containing ruthenium (Ru), and a metal such as titanium (Ti), niobium (Nb), molybdenum (Mo) and zirconium (Zr). The ruthenium alloy preferably contains ruthenium of not less than 50 at % and less than 100 at %. A thickness of the protection film is preferably not less than 1 nm, and preferably not more than 10 nm, more preferably not more than 5 nm. The protection film can be formed by, for example, an ion beam sputtering method or a magnetron sputtering method.

A sheet resistance of the conductive film is preferably not more than 100Ω/□, and a material and a film thickness of the conductive film are not particularly limited. Examples of the material of the conductive film include, for example, a material containing chromium (Cr) or tantalum (Ta). The material containing chromium (Cr) or tantalum (Ta) may contain oxygen (O), nitrogen (N), carbon (C), boron (B), or other elements. Particularly, examples of the material containing chromium include, for example, Cr (simple substance), and a chromium compound such as CrO, CrN, CrON, CrC, CrCN, CrCO, CrCON, CrB, CrOB, CrNB, CrONB, CrCB, CrCNB, CrCOB and CrCONB. Examples of the material containing tantalum include, for example, Ta (simple substance), and a tantalum compound such as TaO, TaN, TaON, TaC, TaCN, TaCO, TaCON, TaB, TaOB, TaNB, TaONB, TaCB, TaCNB, TaCOB and TaCONB.

A thickness of the conductive film is not particularly limited as long as the conductive film functions for an electrostatic chuck use. The thickness is normally about 5 to 50 nm. The conductive film is preferably formed so that film stress of the conductive film is balanced with film stress of the multilayer reflection film and the absorber pattern after a reflective mask is obtained, in particular, after the absorber pattern is formed. The conductive film may be formed before forming the multilayer reflection film, or after forming all of the films disposed at the side of the multilayer reflection film on the to substrate. Further, the conductive film may be formed after forming a part of the films disposed at the side of the multilayer reflection film on the substrate, then the remainder of the films disposed at the side of the multilayer reflection film on the substrate. The conductive film can be formed by, for example, a magnetron sputtering method.

A hard mask film which has different etching property from the absorber film and functions as an etching mask in etching for patterning the absorber film may be provided on the absorber film. After the absorber pattern is formed, the hard mask film may be left as a reflectance reducing film for a part of the absorber film or removed not to be on the reflective mask. Examples of a material of the hard mask film include a material containing chromium (Cr). When the above-mentioned reflectance reducing film is formed on the absorber film, the hard mask film may be formed on the reflectance reducing film. The hard mask film can be formed by, for example, a magnetron sputtering method. A thickness of the hard mask is normally about 5 to 20 nm, however, not limited thereto.

Further, the reflective mask blank may include a resist film such as a photoresist film formed on the side remotest from the substrate used for patterning the absorber film, the hard mask, or other films. The photoresist film is preferably an electron beam (EB) resist.

EXAMPLES

Examples of the invention are given below by way of illustration and not by way of limitation.

Experimental Example 1

A quartz substrate having sizes of 152 mm square and 6.35 mm thick (6025 substrate) was disposed in a chamber of a sputtering apparatus. A WMo film having a thickness of 30 nm was formed on the quartz substrate by magnetron sputtering using a tungsten (W) target and a molybdenum (Mo) target, as sputtering targets, and argon gas as a sputtering gas.

A composition of the obtained WMo film was measured by X-ray photoelectron spectroscopy (XPS). Tungsten and molybdenum contents were 46.0 at % and 54.0 at %, respectively. The surface of the obtained WMo film was observed by an atomic force to microscope (AFM) apparatus. Dents were observed in an area of 1 μm square, and ten dents that have larger areas in the observed image were selected, then the lengths of the dents were measured. An average of the lengths was calculated and was 0.078 μm. The obtained WMo film was heated from about 30° C. to 500° C. in nitrogen atmosphere, and diffraction spectrum was measured by a thin film X-ray diffraction method (In-Plane XRD method). As a result, diffraction peaks that attribute to cubic crystals of tungsten and molybdenum were confirmed at 2θ=40°, 59°, 74°, 88° and 102° in all heating temperature ranges, and tungsten oxide was not detected in the WMo film heated at 500° C.

Experimental Example 2

A WMo film having a thickness of 30 nm was formed on a quartz substrate by the same manner as in Experimental Example 1 except that applied powers to the tungsten (W) target and molybdenum (Mo) target were changed.

A composition of the obtained WMo film was measured by X-ray photoelectron spectroscopy (XPS). Tungsten and molybdenum contents were 71.6 at % and 28.4 at %, respectively. The surface of the obtained WMo film was observed by an atomic force microscope (AFM) apparatus. Dents were observed in an area of 1 μm square, and ten dents that have larger areas in the observed image were selected, then the lengths of the dents were measured. An average of the lengths was calculated and was 0.12 μm.

Experimental Example 3

A WMo film having a thickness of 30 nm was formed on a quartz substrate by the same manner as in Experimental Example 1 except that applied powers to the tungsten (W) target and molybdenum (Mo) target were changed.

A composition of the obtained WMo film was measured by X-ray photoelectron spectroscopy (XPS). Tungsten and molybdenum contents were 25.8 at % and 74.2 at %, respectively. The surface of the obtained WMo film was observed by an atomic force microscope (AFM) apparatus. Dents were observed in an area of 1 μm square, and ten dents that have larger areas in the observed image were selected, then the lengths of the to dents were measured. An average of the lengths was calculated and was 0.048 μm.

Experimental Example 4

A quartz substrate having sizes of 152 mm square and 6.35 mm thick (6025 substrate) was disposed in a chamber of a sputtering apparatus. A WRu film having a thickness of 30 nm was formed on the quartz substrate by magnetron sputtering using a tungsten (W) target and a ruthenium (Ru) target, as sputtering targets, and argon gas as a sputtering gas.

A composition of the obtained WRu film was measured by X-ray photoelectron spectroscopy (XPS). Tungsten and ruthenium contents were 43.9 at % and 56.1 at %, respectively. The surface of the obtained WRu film was observed by an atomic force microscope (AFM) apparatus. Dents were observed in an area of 1 μm square, and ten dents that have larger areas in the observed image were selected, then the lengths of the dents were measured. An average of the lengths was calculated and was 0.033 μm. The obtained WRu film was heated from about 30° C. to 500° C. in nitrogen atmosphere, and diffraction spectrum was measured by a thin film X-ray diffraction method (In-Plane XRD method). As a result, diffraction peaks that attribute to cubic crystal or hexagonal crystal of tungsten and ruthenium were confirmed at 2θ=36°, 68° and 80° in all heating temperature ranges, and tungsten oxide (WO$_3$) was detected in the WRu film heated at 500° C. However, the peak intensity of the tungsten oxide (WO$_3$) was not more than ⅕ of the peak intensity of the tungsten oxide (WO$_3$) detected in a W film having a thickness of 30 nm heated at 500° C. that was formed on a quartz substrate by the same manner with using only a tungsten (W), and was heated from about 30° C. to 500° C. in nitrogen atmosphere.

Experimental Example 5

A quartz substrate having sizes of 152 mm square and 6.35 mm thick (6025 substrate) was disposed in a chamber of a sputtering apparatus. A WMoRu film having a thickness of 30 nm was formed on the quartz substrate by magnetron sputtering using a tungsten (W) target, a molybdenum (Mo) target and a ruthenium (Ru) target, as sputtering targets, and argon gas as a sputtering gas.

A composition of the obtained WMoRu film was measured by X-ray photoelectron spectroscopy (XPS). Tungsten, molybdenum and ruthenium contents were 46.1 at %, 24.9 at % and 29.0 at %, respectively. The surface of the obtained WMoRu film was observed by an atomic force microscope (AFM) apparatus. Dents were observed in an area of 1 μm square, and ten dents that have larger areas in the observed image were selected, then the lengths of the dents were measured. An average of the lengths was calculated and was 0.030 μm. The obtained WMoRu film was heated from about 30° C. to 500° C. in nitrogen atmosphere, and diffraction spectrum was measured by a thin film X-ray diffraction method (In-Plane XRD method). As a result, diffraction peaks that attribute to cubic crystal or hexagonal crystal of tungsten, molybdenum and ruthenium were confirmed at 2θ=39°, 71° and 84° in all heating temperature ranges, and tungsten oxide was not detected in the WMoRu film heated at 500° C.

Experimental Example 6

A quartz substrate having sizes of 152 mm square and 6.35 mm thick (6025 substrate) was disposed in a chamber of a sputtering apparatus. A WMoN film having a thickness of 30 nm was formed on the quartz substrate by magnetron sputtering using a tungsten (W) target and a molybdenum (Mo) target, as sputtering targets, and argon gas, and nitrogen gas as a reactive gas, as sputtering gases.

A composition of the obtained WMoN film was measured by X-ray photoelectron spectroscopy (XPS). Tungsten, molybdenum and nitrogen contents were 33.1 at %. 27.7 at % and 39.2 at %, respectively. The surface of the obtained WMoN film was observed by an atomic force microscope (AFM) apparatus. Dents were observed in an area of 1 μm square, and ten dents that have larger areas in the observed image were selected, then the lengths of the dents were measured. An average of the lengths was calculated and was 0.051 μm. The obtained WMoN film was heated from about 30° C. to 500° C. in nitrogen atmosphere, and diffraction spectrum was measured by a thin film X-ray diffraction method (In-Plane XRD method). As a result, diffraction peaks that attribute to cubic crystal of WMoN was confirmed at 2θ=37°, 43°, 62° and 75° in all heating temperature ranges, and tungsten oxide was not detected in the WMoN film heated at 500° C.

Experimental Example 7

A WMoN film having a thickness of 30 nm was formed on a quartz substrate by the same manner as in Experimental Example 6 except that a flow rate of nitrogen gas as a reactive gas was changed.

A composition of the obtained WMoN film was measured by X-ray photoelectron spectroscopy (XPS). Tungsten, molybdenum and nitrogen contents were 25.0 at %, 22.9 at % and 52.1 at %, respectively. The surface of the obtained WMoN film was observed by an atomic force microscope (AFM) apparatus. Dents were observed in an area of 1 μm square, and ten dents that have larger areas in the observed image were selected, then the lengths of the dents were measured. An average of the lengths was calculated and was 0.039 μm. The obtained WMoN film was heated from about 30° C. to 500° C. in nitrogen atmosphere, and diffraction spectrum was measured by a thin film X-ray diffraction method (In-Plane XRD method). As a result, diffraction peaks that attribute to hexagonal crystal of $WN_2$ was confirmed at 2θ=36°, 45°, 64° and 75° in all heating temperature ranges, and tungsten oxide was not detected in the WMoN film heated at 500° C. Further, it was confirmed that the $WN_2$ has a polycrystalline state with low orientation.

Experimental Example 8

A quartz substrate having sizes of 152 mm square and 6.35 mm thick (6025 substrate) was disposed in a chamber of a sputtering apparatus. A WN film having a thickness of 30 nm was formed on the quartz substrate by magnetron sputtering using a tungsten (W) target as a sputtering target, and argon gas, and nitrogen gas as a reactive gas, as sputtering gases.

A composition of the obtained WN film was measured by X-ray photoelectron spectroscopy (XPS). Tungsten and nitrogen contents were 81.9 at % and 18.1 at %, respectively. The surface of the obtained WN film was observed by an atomic force microscope (AFM) apparatus. Dents were observed in an area of 1 μm square, and ten dents that have larger areas in the observed image were selected, then the lengths of the dents were measured. An average of the lengths was calculated and was 0.065 μm.

Experimental Example 9

A WN film having a thickness of 30 nm was formed on a quartz substrate by the same manner as in Experimental Example 8 except that a flow rate of nitrogen gas as a reactive gas was changed.

A composition of the obtained WN film was measured by X-ray photoelectron spectroscopy (XPS). Tungsten and nitrogen contents were 65.0 at % and 35.0 at %, respectively. The surface of the obtained WN film was observed by an atomic force microscope (AFM) apparatus. Dents were observed in an area of 1 μm square, and ten dents that have larger areas in the observed image were selected, then the lengths of the dents were measured. An average of the lengths was calculated and was 0.061 μm.

Experimental Example 10

A WN film having a thickness of 30 nm was formed on a quartz substrate by the same manner as in Experimental Example 8 except that a flow rate of nitrogen gas as a reactive gas was changed.

A composition of the obtained WN film was measured by X-ray photoelectron spectroscopy (XPS). Tungsten and nitrogen contents were 46.4 at % and 53.6 at %, respectively. The surface of the obtained WN film was observed by an atomic force microscope (AFM) apparatus. Dents were observed in an area of 1 μm square, and ten dents that have larger areas in the observed image were selected, then the lengths of the dents were measured. An average of the lengths was calculated and was 0.054 μm.

Comparative Experimental Example

A quartz substrate having sizes of 152 mm square and 6.35 mm thick (6025 substrate) was disposed in a chamber of a sputtering apparatus. A W film having a thickness of 30 nm was formed on the quartz substrate by magnetron sputtering using a tungsten (W) target as a sputtering target, and argon gas as a sputtering gas.

A surface of the obtained W film was observed by an atomic force microscope (AFM) apparatus. Dents were observed in an area of 1 μm square, and ten dents that have larger areas in the observed image were selected, then the lengths of the dents were measured. An average of the lengths was calculated and was 0.157 μm. The obtained W film was heated from about 30° C. to 500° C. in nitrogen atmosphere, and diffraction spectrum was measured by a thin film X-ray diffraction method (In-Plane XRD method). As a result, diffraction peaks that attribute to tungsten was confirmed at 2θ=40°, 59°, 74°, 87° and 101° in all heating temperature ranges, and tungsten oxide ($WO_3$) was detected in the W film heated at 500° C.

Japanese Patent Application Nos. 2021-033118 and 2022-005408 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A reflective mask blank that is a material for a reflective mask used in EUV lithography using EUV light as exposure light, comprising a substrate, a multilayer reflection film that is formed on one main surface of the substrate and reflects the exposure light, and an absorber film that is formed on the multilayer reflection film and absorbs the exposure light, wherein
  the absorber film consists of
  (a) tungsten; and
  (b) at least one element selected from the group consisting of tantalum, molybdenum, vanadium, zirconium, ruthenium, gold, platinum, rhodium, silicon and germanium,
  (c) at least one light element selected from the group consisting of nitrogen, oxygen, carbon and hydrogen, or both (b) and (c).

2. The reflective mask blank of claim 1 wherein the absorber film consists of (a) tungsten, and (b) at least one element selected from the group consisting of tantalum, molybdenum, vanadium, zirconium, ruthenium, gold, platinum, rhodium, silicon and germanium.

3. The reflective mask blank of claim 1 wherein the absorber film consists of (a) tungsten, (b) at least one element selected from the group consisting of tantalum, molybdenum, vanadium, zirconium, ruthenium, gold, platinum, rhodium, silicon and germanium, and (c) at least one light element selected from the group consisting of nitrogen, oxygen, carbon and hydrogen.

4. The reflective mask blank of claim 1 wherein the element (b) is either or both of molybdenum and ruthenium.

5. The reflective mask blank of claim 1 wherein a content of the element (b) in the absorber film is not less than 1 at % and not more than 80 at %.

6. The reflective mask blank of claim 1 wherein the absorber film consists of (a) tungsten, and (c) at least one light element selected from the group consisting of nitrogen, oxygen, carbon and hydrogen.

7. The reflective mask blank of claim 6 wherein a content of (c) at least one light element selected from the group consisting of nitrogen, oxygen, carbon and hydrogen is not less than 10 at % and not more than 80 at %.

8. The reflective mask blank of claim 1 wherein a content of (a) tungsten in the absorber film is not less than 20 at % and not more than 99 at %.

9. The reflective mask blank of claim 1 wherein the absorber film has a refractive index n of not more than 0.94 with respect to the exposure light.

10. The reflective mask blank of claim 1 wherein the absorber film has a thickness of not more than 70 nm.

11. The reflective mask blank of claim 4 comprising a protection film composed of a material containing ruthenium (Ru) wherein the protection film is intervened between the multilayer reflection film and the absorber film, is contact with the multilayer reflection film, and has different etching property from the absorber film.

12. The reflective mask blank of claim 1 further comprising a conductive film formed on the other main surface of the substrate.

13. The reflective mask blank of claim 1 further comprising a film containing chromium formed as an etching mask on the absorber film.

14. A reflective mask manufactured from the reflective mask blank of claim 1.

15. The reflective mask blank of claim 6 comprising a protection film wherein the protection film is intervened between the multilayer reflection film and the absorber film, is contact with the multilayer reflection film, and has different etching property from the absorber film.

* * * * *